(12) United States Patent
Park et al.

(10) Patent No.: US 9,646,769 B2
(45) Date of Patent: May 9, 2017

(54) MULTILAYER CERAMIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Seok Kyoon Woo, Suwon-Si (KR); Soon Ju Lee, Suwon-Si (KR); So Yeon Song, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/877,765

(22) Filed: Oct. 7, 2015

(65) Prior Publication Data

US 2016/0126015 A1 May 5, 2016

(30) Foreign Application Priority Data

Nov. 3, 2014 (KR) .................... 10-2014-0151096

(51) Int. Cl.
*H01G 4/30* (2006.01)
*H01G 4/248* (2006.01)
(Continued)

(52) U.S. Cl.
CPC ............ *H01G 4/30* (2013.01); *H01G 4/012* (2013.01); *H01G 4/12* (2013.01); *H01G 4/248* (2013.01);
(Continued)

(58) Field of Classification Search
CPC .......... H01G 4/30; H01G 4/012; H01G 4/248; H05K 1/181; H05K 1/111; H05K 2201/10015
(Continued)

(56) References Cited

U.S. PATENT DOCUMENTS

2010/0123995 A1  5/2010 Otsuka et al.
2010/0188798 A1  7/2010 Togashi et al.
(Continued)

FOREIGN PATENT DOCUMENTS

JP  11-251176 A  9/1999
JP  2008-182276 A  8/2008
(Continued)

OTHER PUBLICATIONS

Korean Office Action issued in Korean Application No. 10-2014-0151096, dated Feb. 22, 2016, with English Translation.

*Primary Examiner* — Timothy Thompson
*Assistant Examiner* — Charles Pizzuto
(74) *Attorney, Agent, or Firm* — McDermott Will & Emery LLP

(57) ABSTRACT

A multilayer ceramic component including a multilayer ceramic capacitor including first and second external electrodes disposed on a mounting surface of a ceramic body; and first and second terminal electrodes each including an upper horizontal part disposed on a lower surface of the respective external electrode, a lower horizontal part disposed below the upper horizontal part and spaced apart from the upper horizontal part, and a connecting part connecting the upper horizontal part and the lower horizontal part, the connecting part having a plurality of openings alternately facing opposite end surfaces of the ceramic body.

13 Claims, 11 Drawing Sheets

(51) Int. Cl.
*H01G 4/012* (2006.01)
*H01G 4/12* (2006.01)
*H05K 1/18* (2006.01)
*H05K 1/11* (2006.01)
*H05K 3/34* (2006.01)

(52) U.S. Cl.
CPC ........... *H05K 1/181* (2013.01); *H05K 3/3426* (2013.01); *H05K 1/111* (2013.01); *H05K 2201/0311* (2013.01); *H05K 2201/10015* (2013.01); *H05K 2201/10757* (2013.01); *H05K 2201/10946* (2013.01); *H05K 2201/2045* (2013.01); *Y02P 70/611* (2015.11); *Y02P 70/613* (2015.11)

(58) Field of Classification Search
USPC ....................................... 174/260; 361/301.4
See application file for complete search history.

(56) References Cited

U.S. PATENT DOCUMENTS

| | | | |
|---|---|---|---|
| 2013/0100579 A1* | 4/2013 | Morito | ..................... H01G 2/00 361/321.2 |
| 2016/0071650 A1* | 3/2016 | McConnell | .......... B23K 1/0016 29/25.42 |

FOREIGN PATENT DOCUMENTS

| | | | |
|---|---|---|---|
| JP | 2008182276 | * | 8/2008 |
| JP | 2010-123614 A | | 6/2010 |
| JP | 2012-33651 A | | 2/2012 |
| JP | 2012-33655 A | | 2/2012 |
| JP | 2012033651 A | * | 2/2012 |
| JP | 2012033655 | * | 2/2012 |
| KR | 10-2010-0087622 A | | 8/2010 |

* cited by examiner

MULTILAYER CERAMIC COMPONENT AND BOARD HAVING THE SAME

CROSS-REFERENCE TO RELATED APPLICATION

This application claims the benefit of priority to Korean Patent Application No. 10-2014-0151096, filed on Nov. 3, 2014 with the Korean Intellectual Property Office, the entirety of which is incorporated herein by reference.

BACKGROUND

The present disclosure relates to a multilayer ceramic component and a board having the same.

Electronic components using a ceramic material include capacitors, inductors, piezoelectric elements, varistors, thermistors, and the like.

A multilayer ceramic capacitor (MLCC), a representative ceramic electronic component, may be used in various electronic apparatuses due to advantages thereof such as having a relatively small size, high capacitance, and ease of mounting.

For example, the multilayer ceramic capacitor is a chip type condenser mounted on the boards of several types of electronic product, such as an image display device, for example, a liquid crystal display (LCD), a plasma display panel (PDP), or the like, a computer, a personal digital assistant (PDA), a cellular phone, and the like, to serve to charge electricity therein or discharge electricity therefrom.

The multilayer ceramic capacitor may have a structure in which a plurality of dielectric layers and internal electrodes are alternately disposed such that internal electrodes having different polarities are interposed between the dielectric layers.

Here, since the dielectric layers may have piezoelectric properties, when a direct current (DC) or alternating current (AC) voltage is applied to the multilayer ceramic capacitor, a piezoelectric phenomenon may occur between the internal electrodes, generating periodic vibrations while expanding and contracting a volume of a ceramic body, depending on a frequency thereof.

These vibrations may be transferred to a board through external electrodes of the multilayer ceramic capacitor and solders connecting the external electrodes and the board to each other, such that an entire board may act as a sound reflecting surface to generate vibration sound, experienced by users as noise.

The vibration sound may correspond to an audio frequency range of 20 to 20,000 Hz causing listener discomfort. The vibration sound causing listener discomfort as described above may be known as acoustic noise.

Further, in recent electronic devices, a relative degree of silence of mechanical components has been achieved, such that the acoustic noise generated in the multilayer ceramic capacitor as described above may become more prominent.

When the device is operated in a silent environment, a user may experience acoustic noise as the sound of a mechanical failure and determine that a fault has been generated in the device.

In addition, in a device provided with an audio circuit, acoustic noise may overlap with audio output, such that audio quality of the device may be deteriorated.

SUMMARY

One aspect of the present disclosure provides a multilayer ceramic component in which acoustic noise may be decreased, and a board having the same.

According to one aspect of the present disclosure, a multilayer ceramic component comprises a multilayer ceramic capacitor including first and second external electrodes disposed on a mounting surface of a ceramic body; and first and second terminal electrodes each including: an upper horizontal part disposed on a lower surface of the respective external electrode, a lower horizontal part disposed below the upper horizontal part and spaced apart from the upper horizontal part, and a connecting part connecting the upper horizontal part and the lower horizontal part, the connecting part having a plurality of openings alternately facing opposite end surfaces of the ceramic body.

Each of the connecting parts of the first and second terminal electrodes may include: a plurality of horizontal parts disposed between the upper horizontal part and the lower horizontal part, first vertical parts connecting first ends of adjacent horizontal parts to each other, and second vertical parts connecting second ends of adjacent horizontal parts to each other, wherein the first and second vertical parts are alternately disposed in a vertical direction.

The vertical parts of the first and second terminal electrodes may have curved surfaces.

Further, there may be first and second conductive adhesive layers disposed between the lower surfaces of the first and second external electrodes and the upper horizontal parts of the first and second terminal electrodes, respectively.

The first and second conductive adhesive layers may comprise a high melting-point solder or a conductive paste.

The widths of the upper horizontal parts of the first and second terminal electrodes may be narrower than widths of the first and second conductive adhesive layers, respectively.

The widths of the upper horizontal parts of the first and second terminal electrodes may be wider than widths of the first and second conductive adhesive layers, respectively.

The ceramic body may comprise a plurality of dielectric layers stacked in a thickness direction, a plurality of first and second internal electrodes disposed with at least one dielectric layer disposed between adjacent first and second internal electrodes, the first and second internal electrodes being alternately exposed through opposite end surfaces of the ceramic body in a length direction, and the first and second external electrodes comprise first and second front surface parts respectively covering opposite end surfaces of the ceramic body in the length direction and respectively connected to the first and second internal electrodes, and first and second band parts respectively extended from the first and second front surface parts to cover portions of circumferential surfaces of the ceramic body, respectively.

The ceramic body may further comprise cover layers disposed on an uppermost internal electrode and beneath a lowermost internal electrode.

The ceramic body may include a plurality of dielectric layers layered in a width direction, a plurality of first internal electrodes having first lead parts exposed through a lower surface of the ceramic body, and a plurality of second internal electrodes disposed to alternate with the first internal electrodes with at least one dielectric layer disposed between adjacent first and second internal electrodes and having second lead parts exposed through the lower surface of the ceramic body and disposed to be spaced apart from the first lead parts in a length direction, and the first and second external electrodes are disposed on the lower surface of the ceramic body to be spaced apart from each other and connected to the first and second lead parts, respectively.

The first and second external electrodes may extend from the lower surface of the ceramic body to portions of side surfaces of the ceramic body.

Further, there may be third and fourth external electrodes disposed on an upper surface of the ceramic body to be spaced apart from each other, wherein the first internal electrodes have third lead parts exposed through the upper surface of the ceramic body and connected to the third external electrode, and the second internal electrodes have fourth lead parts exposed through the upper surface of the ceramic body and connected to the fourth external electrode.

The third and fourth external electrodes may extend from the upper surface of the ceramic body to portions of side surfaces of the ceramic body.

According to another aspect of the present disclosure, a board having a multilayer ceramic component may comprise a circuit board having a plurality of electrode pads; and a multilayer ceramic component mounted on the circuit board such that lower horizontal parts of the terminal electrodes are bonded to the electrode pads.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Figure 1:
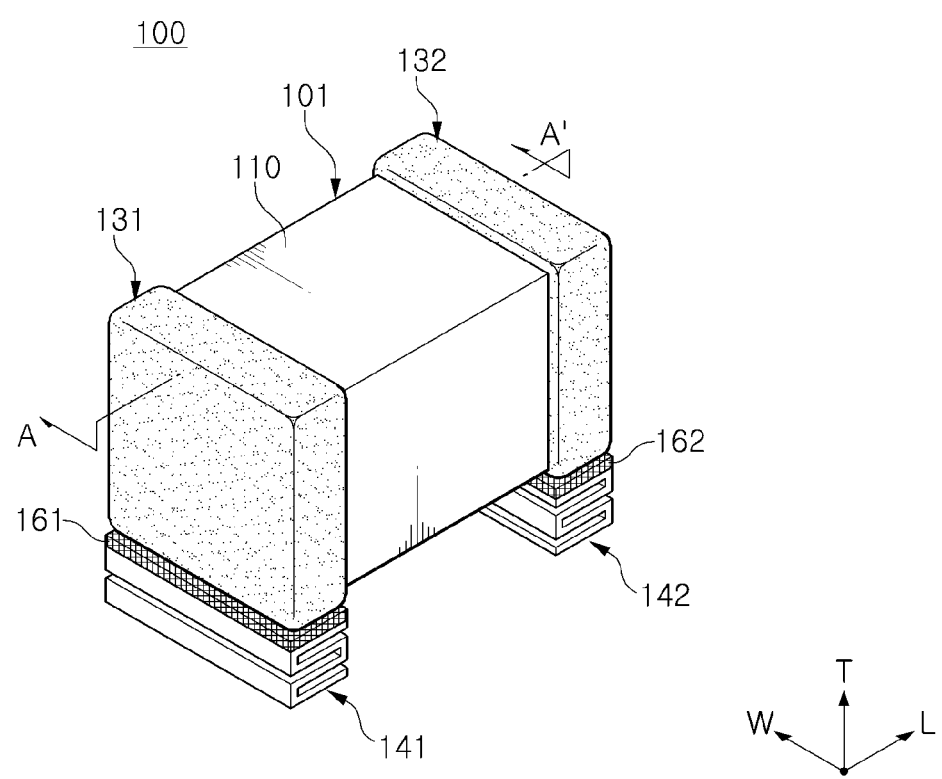
FIG. 1 is a perspective view schematically illustrating a multilayer ceramic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Component

Figure 2:
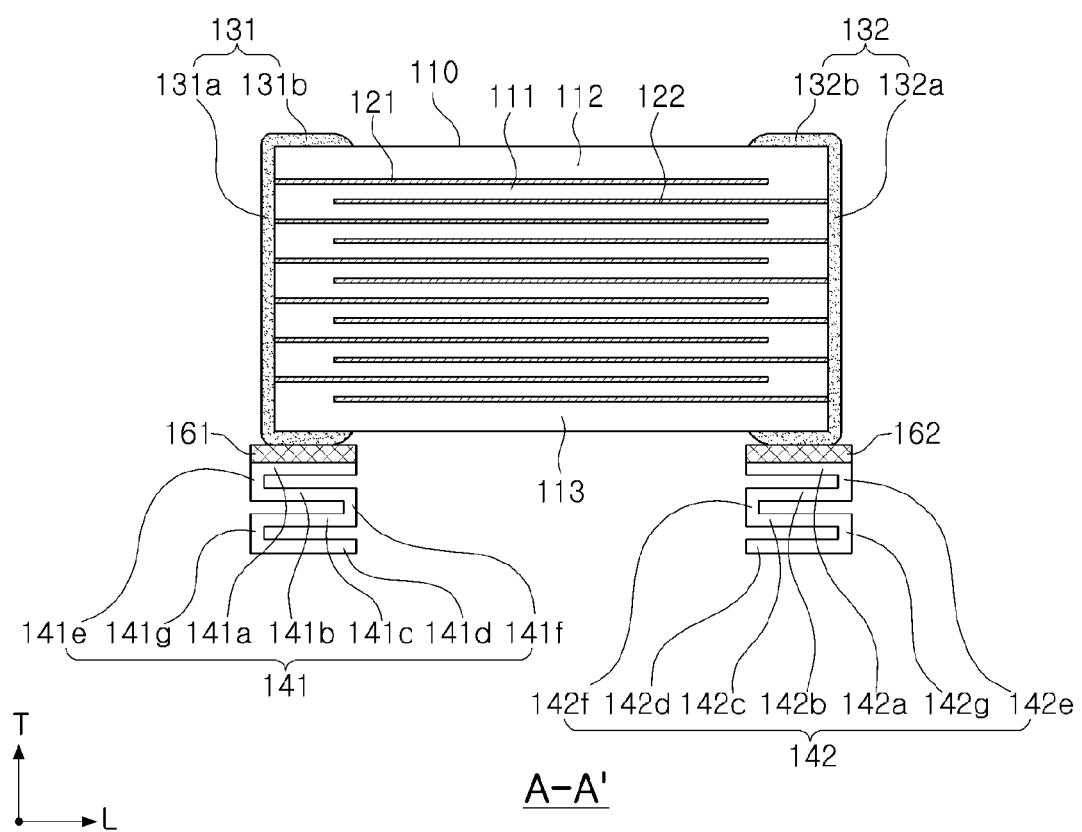
FIG. 2 is a cross-sectional view of an example of a structure of internal electrodes of the multilayer ceramic component according to an exemplary embodiment in the present disclosure taken along line A-A' of FIG. 1.

FIG. 1 is a perspective view schematically illustrating a multilayer ceramic component according to an exemplary embodiment in the present disclosure. FIG. 2 is a cross-sectional view of an example of a structure of internal electrodes of the multilayer ceramic component taken along line A-A' of FIG. 1.

Referring to FIGS. 1 and 2, a multilayer ceramic component 100 may include a multilayer ceramic capacitor 101; and first and second terminal electrodes 141 and 142.

The multilayer ceramic capacitor 101 may include a ceramic body 110; first and second internal electrodes 121 and 122; and first and second external electrodes 131 and 132 disposed on a mounting surface of the ceramic body 110 to be spaced apart from each other.

In addition, the multilayer ceramic component 100 according to the present exemplary embodiment may further include first and second conductive adhesive layers 161 and 162.

The first and second conductive adhesive layers 161 and 162 may electrically connect the first and second external electrodes 131 and 132 of the multilayer ceramic capacitor 101 and the first and second terminal electrodes 141 and 142 to each other, respectively.

The ceramic body 110 may be formed by stacking a plurality of dielectric layers 111 in a thickness direction T and then sintering the plurality of dielectric layers 111.

Here, respective adjacent dielectric layers 111 of the ceramic body 110 may be integrated with each other so that boundaries therebetween may not be readily apparent.

In addition, the ceramic body 110 may have a hexahedral shape. However, a shape of the ceramic body 110 is not limited thereto.

In the present exemplary embodiment, for convenience of explanation, upper and lower surfaces of the ceramic body 110 refer to surfaces of the ceramic body 110 opposing each other in the thickness direction T in which the dielectric layers 111 of the ceramic body 110 are stacked, first and second end surfaces of the ceramic body 110 refer to surfaces of the ceramic body 110 connecting the upper and lower surfaces to each other and opposing each other in a length direction L, and first and second side surfaces of the ceramic body 110 refer to surfaces of the ceramic body 110 vertically intersecting with the first and second end surfaces and opposing each other in a width direction W.

Meanwhile, the ceramic body 110 may have an upper cover layer 112 formed to a predetermined thickness on the uppermost internal electrode and a lower cover layer 113 formed beneath the lowermost internal electrode.

Here, the upper cover layer 112 and the lower cover layer 113 may be formed of the same composition as that of the dielectric layers 111 and may be formed by stacking one or more dielectric layers not including internal electrodes on the uppermost internal electrode of the ceramic body 110 and beneath the lowermost internal electrode of the ceramic body 110, respectively.

The dielectric layer 111 may contain a high-k ceramic material, for example, a barium titanate ($BaTiO_3$)-based ceramic powder, or the like. However, a material of the dielectric layer 111 is not limited thereto.

An example of the barium titanate ($BaTiO_3$)-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, in which Ca, Zr, or the like, is partially dissolved in $BaTiO_3$. However, an example of the barium titanate ($BaTiO_3$)-based ceramic powder is not limited thereto.

In addition, the dielectric layer 111 may further contain one or more of a ceramic additive, an organic solvent, a plasticizer, a binder, and a dispersant.

As the ceramic additive, for example, a transition metal oxide or carbide, a rare earth element, magnesium (Mg), aluminum (Al), or the like, may be used.

The first and second internal electrodes 121 and 122 may be formed on ceramic sheets forming the dielectric layers 111, stacked, and then sintered, such that they are alternately disposed in the thickness direction in the ceramic body 110 with respective dielectric layers 111 interposed therebetween.

The first and second internal electrodes 121 and 122, electrodes having different polarities, may be disposed to face each other in a direction in which the dielectric layers 111 are stacked and may be electrically insulated from each other by the dielectric layers 111 disposed therebetween.

One end of the first and second internal electrodes 121 and 122 may be exposed through first and second end surfaces of the ceramic body 110 in the length direction, respectively.

The end portions of the first and second internal electrodes 121 and 122 alternately exposed through the first and second end surfaces of the ceramic body 110 in the length direction as described above may be electrically connected to the first and second external electrodes 131 and 132, respectively, on the first and second end surfaces of the ceramic body 110 in the length direction.

Here, the first and second internal electrodes 121 and 122 may be formed of a conductive metal, for example, a material such as nickel, a nickel alloy, or the like. However, materials of the first and second internal electrodes 121 and 122 are not limited thereto.

According to the configuration as described above, when predetermined voltages are applied to the first and second external electrodes 131 and 132, electric charges may be accumulated between the first and second internal electrodes 121 and 122 facing each other.

Here, a capacitance of the multilayer ceramic capacitor 101 may be in proportion to an area at which the first and second internal electrodes 121 and 122 overlap with each other in the direction in which the dielectric layers 111 are stacked.

The first and second external electrodes 131 and 132 may be disposed on both end portions of the ceramic body 110 in the length direction, respectively, and include first and second front surface parts 131a and 132a and first and second band parts 131b and 132b, respectively.

The first and second front surface parts 131a and 132a may cover the first and second end surfaces of the ceramic body 110 in the length direction, respectively, and be electrically connected to exposed end portions of the first and second internal electrodes 121 and 122, respectively.

The first and second band parts 131b and 132b may be extended from the first and second front surface parts 131a and 132a, respectively, to cover portions of circumferential surfaces of the ceramic body 110.

Meanwhile, plating layers (not illustrated) may be formed on the first and second external electrodes 131 and 132. The plating layers may include first and second nickel (Ni) plating layers respectively formed on the first and second external electrodes 131 and 132 and first and second tin (Sn) plating layers respectively formed on the first and second nickel plating layers, as an example.

The first terminal electrode 141 may include a first upper horizontal part 141a, a first lower horizontal part 141d, and a first connecting part.

The first upper horizontal part 141a may be disposed below a lower surface of the first band part 131b of the first external electrode 131.

The first lower horizontal part 141d may face the first upper horizontal part 141a in the thickness direction and may be disposed below the first upper horizontal part 141a to be spaced apart from the first upper horizontal part 141a by a predetermined interval.

The first connecting part may connect the first upper horizontal part 141a and the first lower horizontal part 141d to each other. In addition, the first connecting part may have a plurality of space parts alternately open toward both end surfaces of the ceramic body 110 in the length direction. Here, a portion of the space part open toward an outer side of the ceramic body 110 in the length direction may serve as a solder pocket in which solder is accommodated at the time of mounting the multilayer ceramic component on a board.

According to an exemplary embodiment in the present disclosure, the first connecting part may include first and second horizontal parts 141b and 141c disposed between the first upper horizontal part 141a and the first lower horizontal part 141d to be spaced apart from each other in a vertical direction.

In addition, the first connecting part may include a plurality of first vertical parts 141e and 141g connecting one ends of the first upper horizontal part 141a and the first horizontal part 141b disposed externally in the L direction to each other and connecting one ends of the first lower horizontal part 141d and the second horizontal part 141c disposed externally in the L direction to each other, respectively, and a second vertical part 141f connecting the other end portions of the first horizontal part 141b and the second horizontal part 141c disposed on an inner side in the L direction to each other.

Although a configuration in which the number of horizontal parts of the first terminal electrode is two and the number of vertical parts of the first terminal electrode is three has been illustrated and described, the numbers and forms of horizontal parts and vertical parts in the first terminal electrode are not limited thereto. For example, the number of horizontal parts may be two or more while the number of vertical parts may be three or more.

The first terminal electrode 141 configured as described above may partially absorb mechanical vibrations generated due to piezoelectric properties of the multilayer ceramic capacitor 101 through elastic force to decrease an amount of vibrations transferred to the board, thereby decreasing acoustic noise.

Particularly, the vibrations generated in the multilayer ceramic capacitor 101 may be dampened in the first connecting part of the first terminal electrode 141. Therefore, the amount of vibrations transferred to the board may be decreased.

In addition, when the multilayer ceramic capacitor 101 is mounted on the board, the solder may bond the first terminal electrode 141 and the board to each other. In this case, the first connecting part may space the multilayer ceramic capacitor 101 apart from the board by a predetermined distance, and since the solder is accommodated in a groove provided between the first horizontal part 141b and the second horizontal part 141c of the first connecting part, a phenomenon in which the solder flows along the first connecting part of the first terminal electrode 141 to directly contact the first external electrode 131 may be prevented, thereby further decreasing acoustic noise.

The second terminal electrode 142 may include a second upper horizontal part 142a, a second lower horizontal part 142d, and a second connecting part.

The second upper horizontal part 142a may be disposed below a lower surface of the second band part 132b of the second external electrode 132.

The second lower horizontal part 142d may face the second upper horizontal part 142a in the thickness direction and be disposed below the second upper horizontal part 142a to be spaced apart from the second upper horizontal part 142a by a predetermined interval.

The second connecting part may connect the second upper horizontal part 142a and the second lower horizontal part 142d to each other. In addition, the second connecting part may have a plurality of space parts alternately open toward both end surfaces of the ceramic body 110 in the length direction. Here, a portion of the space part open toward an outer side of the ceramic body 110 in the length direction may serve as a solder pocket in which solder is accommodated at the time of mounting the multilayer ceramic component on the board.

According to an exemplary embodiment in the present disclosure, the second connecting part may include first and second horizontal parts 142b and 142c disposed between the second upper horizontal part 142a and the second lower horizontal part 142d to be spaced apart from each other in the vertical direction.

In addition, the second connecting part may include a plurality of first vertical parts 142e and 142g connecting one ends of the second upper horizontal part 142a and the first horizontal part 142b disposed externally in the L direction to each other and connecting one ends of the second lower horizontal part 142d and the second horizontal part 142c disposed externally in the L direction to each other, respectively, and a second vertical part 142f connecting the other end portions of the first horizontal part 142b and the second horizontal part 142c disposed on an inner side in the L direction to each other.

Although a configuration in which the number of horizontal parts of the second terminal electrode is two and the number of vertical parts of the second terminal electrode is three has been illustrated and described, the numbers and forms of horizontal parts and vertical parts in the second terminal electrode are not limited thereto. For example, the number of horizontal parts may be two or more and the number of vertical parts may be three or more.

The second terminal electrode 142 configured as described above may partially absorb mechanical vibrations generated due to piezoelectric properties of the multilayer ceramic capacitor 101 by elastic force to decrease an amount of the vibrations transferred to the board, thereby decreasing acoustic noise.

Particularly, the vibrations generated in the multilayer ceramic capacitor 101 may be dampened in the second connecting part of the second terminal electrode 142. Therefore, the vibrations transferred to the board may be decreased.

In addition, when the multilayer ceramic capacitor 101 is mounted on the board, the solder may bond the second terminal electrode 142 and the board to each other. In this case, the second connecting part may space the multilayer ceramic capacitor 101 apart from the board by a predetermined distance, and since the solder is accommodated in a groove provided between the first horizontal part 142b and the second horizontal part 142c of the second connecting part, a phenomenon in which the solder flows along the second connecting part of the second terminal electrode 142 to directly contact the second external electrode 132 may be prevented, thereby further decreasing the acoustic noise.

Figure 3:
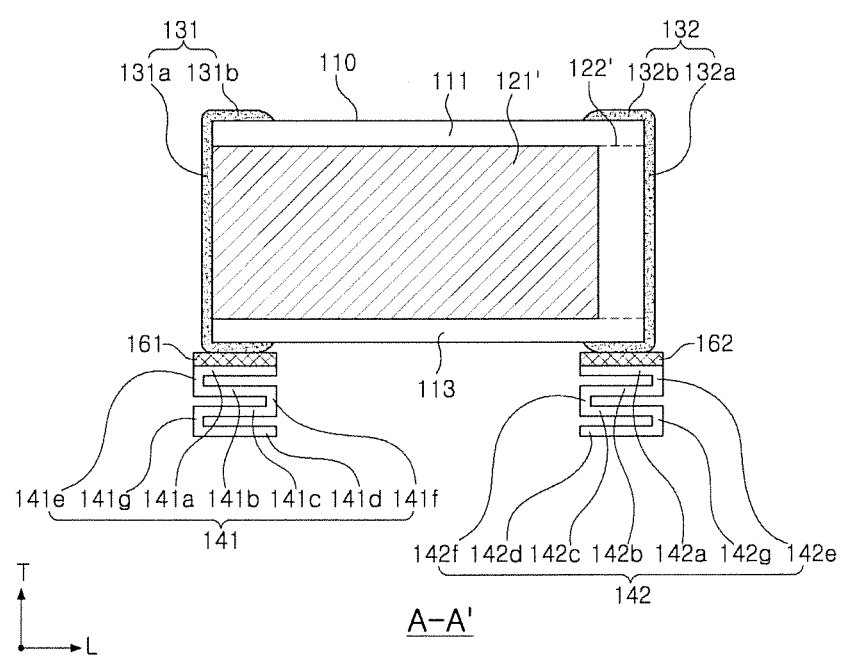
FIG. 3 is a cross-sectional view of another example of a structure of internal electrodes of the multilayer ceramic component according to an exemplary embodiment in the present disclosure taken along line A-A' of FIG. 1.

FIG. 3 is a cross-sectional view of another example of a structure of internal electrodes of the multilayer ceramic component according to an exemplary embodiment in the present disclosure taken along line A-A' of FIG. 1.

Referring to FIG. 3, a ceramic body 110 according to the present exemplary embodiment may be configured by stacking a plurality of dielectric layers 111 in the width direction W.

Here, first and second internal electrodes 121' and 122' may be formed on ceramic sheets forming the dielectric layers 111, stacked, and then sintered, such that they are alternately disposed in the width direction in the ceramic body 110 with respective dielectric layers 111 interposed therebetween.

Figure 4:
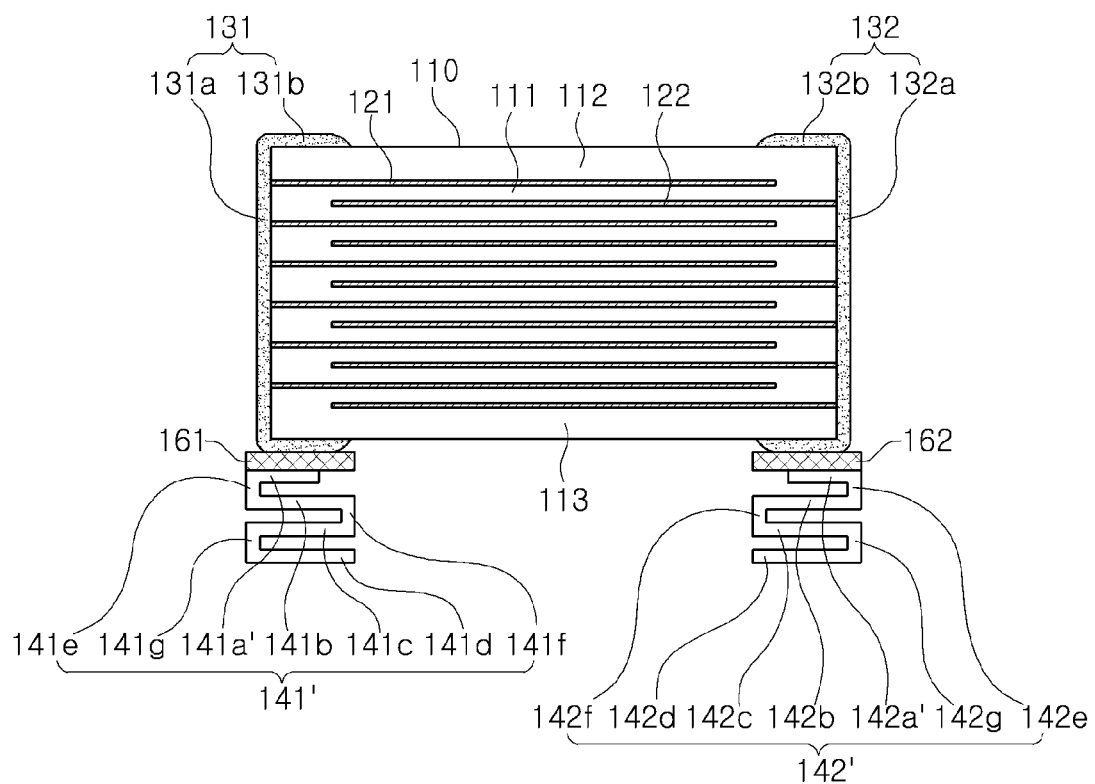
FIG. 4 is a cross-sectional view illustrating another example of terminal electrodes in the multilayer ceramic component according to an exemplary embodiment in the present disclosure.
Figure 5:
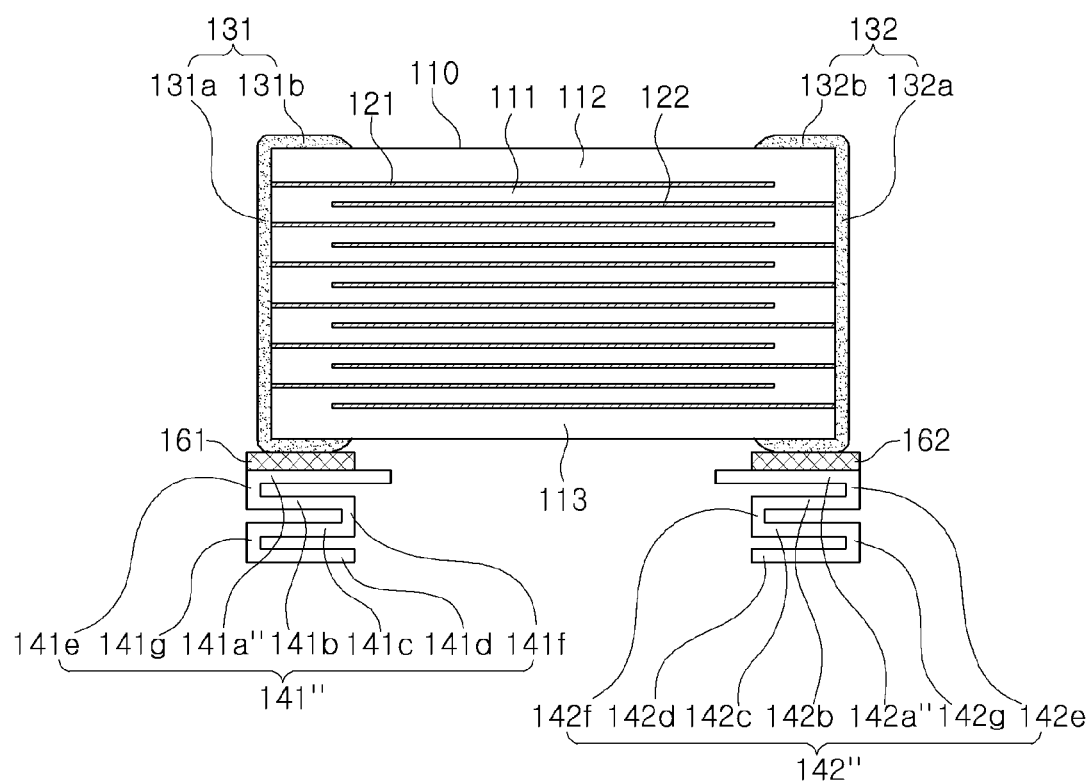
FIG. 5 is a cross-sectional view illustrating another example of terminal electrodes in the multilayer ceramic component according to an exemplary embodiment in the present disclosure.
Figure 6:
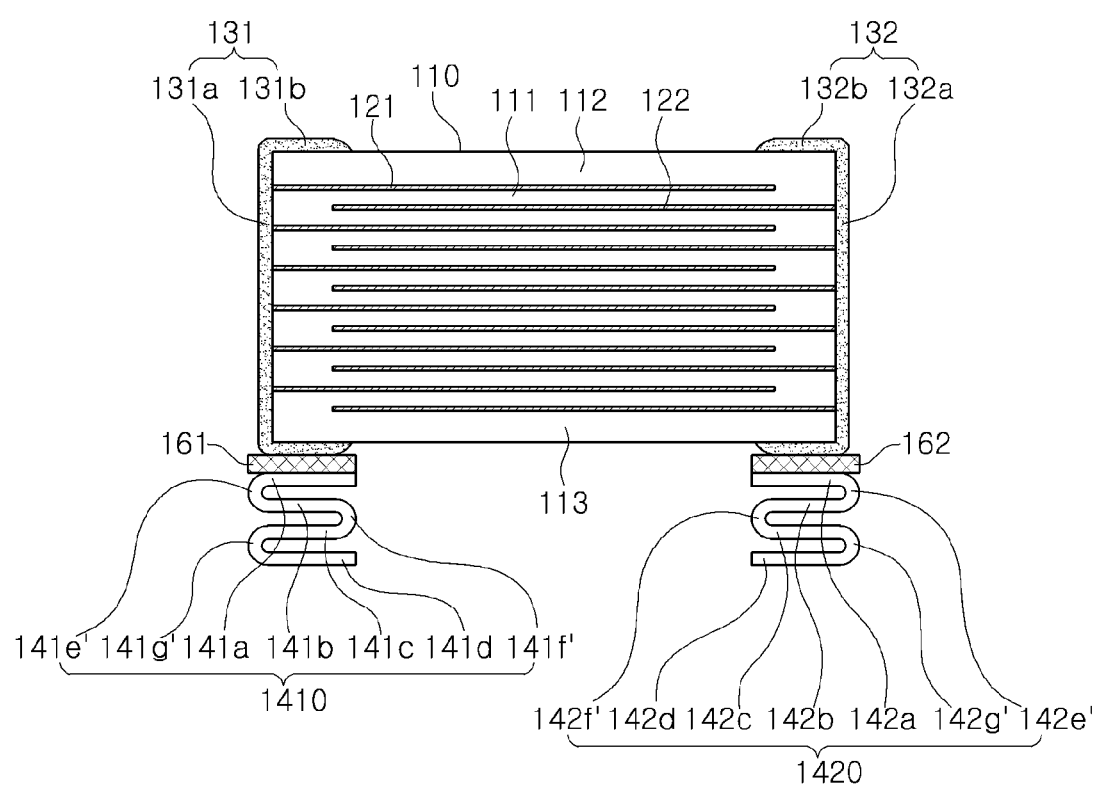
FIG. 6 is a cross-sectional view illustrating another example of terminal electrodes in the multilayer ceramic component according to an exemplary embodiment in the present disclosure.

FIGS. 4 through 6 illustrate other examples of terminal electrodes. Although widths of the upper horizontal parts and the lower horizontal parts of the first and second terminal electrodes are the same as each other in the exemplary embodiment in the present disclosure described above, widths of upper horizontal parts and lower horizontal parts of first and second terminal electrodes according to the present disclosure may not be the same as each other, if necessary.

Referring to FIG. 4, lengths of first and second upper horizontal parts 141a' and 142a' of first and second terminal electrodes 141' and 142' in the L direction may be shorter than those of first and second conductive adhesive layers 161 and 162 in the L direction.

Therefore, contact areas between first and second external electrodes 131 and 132 and the first and second upper horizontal parts 141a' and 142a' may be limited, such that an amount of piezoelectric vibrations of the multilayer ceramic capacitor transferred to the first and second upper horizontal parts 141a' and 142a' is limited, whereby acoustic noise may be further decreased.

In addition, referring to FIG. 5, lengths of first and second upper horizontal parts 141a'' and 142a'' of first and second terminal electrodes 141'' and 142'' in the L direction may be greater than those of first and second conductive adhesive layers 161 and 162 in the L direction.

Therefore, contact areas between first and second external electrodes 131 and 132 and the first and second upper horizontal parts 141a'' and 142a'' may be increased, such that adhesiveness of the multilayer ceramic capacitor may be improved. This structure may be used in, for example, an environment in which it is likely that the multilayer ceramic capacitor will be separated due to the generation of frequent of external impacts.

In addition, referring to FIG. 6, first vertical parts 141e', 141g', 142e', and 142g' and second vertical parts 141f' and 142f' of first and second terminal electrodes 1410 and 1420 may have curved surfaces.

In this case, stress transferred from the multilayer ceramic capacitor 101 may be more efficiently dispersed and be decreased more in the vertical parts having the curved surface than in vertical parts having a flat surface, such that vibrations transferred to the board may be decreased, whereby an effect of a decrease in acoustic noise may be further improved.

In addition, the first and second terminal electrodes 141 and 142 may be formed of a conductive material, for example, one of several materials such as a conductive metal, a conductive resin such as a conductive epoxy, or the like, a substrate coated with a metal, or the like. However, materials of the terminal electrodes 141 and 142 are not limited thereto.

In the present exemplary embodiment, the first and second conductive adhesive layers 161 and 162 may be interposed between the lower surfaces of the first and second band parts 131b and 132b of the first and second external electrodes 131 and 132 and the first and second upper horizontal parts 141a and 142a of the first and second terminal electrodes 141 and 142, respectively, to electrically connect the first and second external electrodes 131 and 132 and the first and second terminal electrodes 141 and 142 to each other, respectively.

Here, the first and second conductive adhesive layers 161 and 162 may be formed of a high melting-point solder or a conductive paste. However, materials of the first and second conductive adhesive layers 161 and 162 are not limited thereto.

Here, since the first and second external electrodes 131 and 132 and the first and second terminal electrodes 141 and 142 surface-contact each other by the first and second conductive adhesive layers 161 and 162, a problem in terms of adhesiveness may not occur.

According to the present exemplary embodiment, when voltages having different polarities are applied to the first and second external electrodes 131 and 132 formed on the first and second end surfaces of the ceramic body 110 in the length direction in a state in which the multilayer ceramic capacitor 101 is mounted on the board, the ceramic body 110 may expand and contract in the thickness direction due to an inverse piezoelectric effect occurring in the dielectric layers 111, and the first and second end surfaces of the first and second external electrodes 131 and 132 in the length direction on which the first and second external electrodes 131 and 132 are formed may contract and expand as opposed to the expansion and the contraction of the ceramic body 110 in the thickness direction due to the Poisson effect.

Here, the first and second terminal electrodes 141 and 142 may allow a predetermined interval to be secured between the multilayer ceramic capacitor 101 and the board to allow the first and second external electrodes 131 and 132 to not directly contact the solders, and since the solder is accommodated in grooves provided in the first and second connecting parts, a phenomenon in which the solder flows along the first and second connecting parts of the first and second terminal electrodes 141 and 142 to directly contact the first and second external electrodes 131 and 132 may be prevented, thereby further decreasing acoustic noise.

In addition, vibrations transferred to the board through the first and second external electrodes 131 and 132 of the multilayer ceramic capacitor may be partially absorbed by the elastic force of the first and second connecting parts, thereby decreasing acoustic noise.

In addition, the first and second connecting parts of the first and second terminal electrodes 141 and 142 may absorb mechanical stress and external impacts generated due to warpage of the board, or the like, to prevent stress from being transferred to the multilayer ceramic capacitor 101 and to prevent the generation of cracks in the multilayer ceramic capacitor 101.

Modified Example

Figure 7:
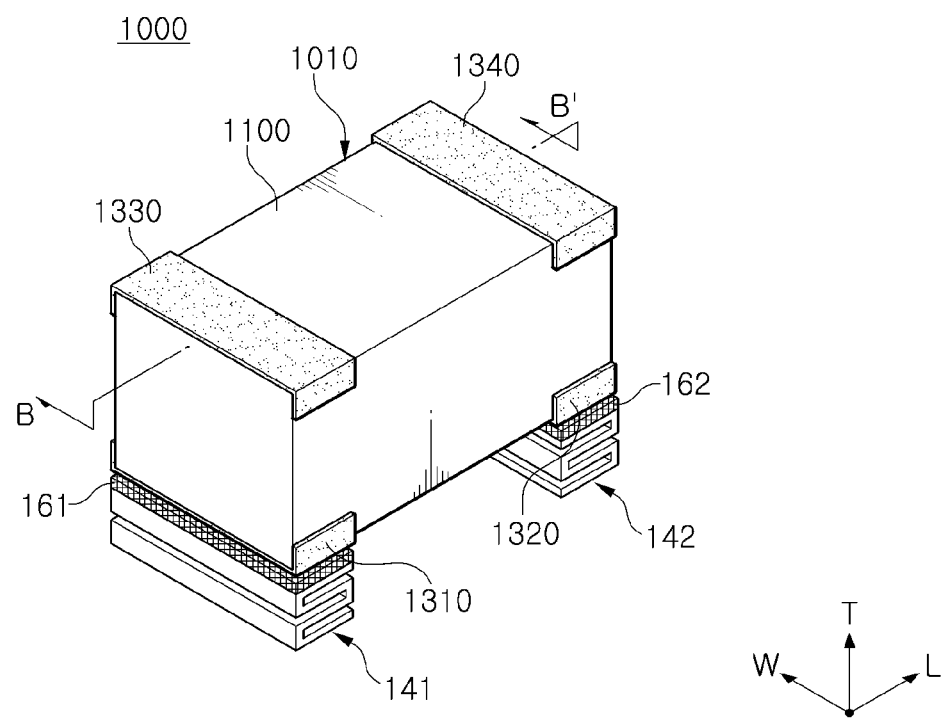
FIG. 7 is a perspective view schematically illustrating a multilayer ceramic component according to another exemplary embodiment in the present disclosure.
Figure 8:
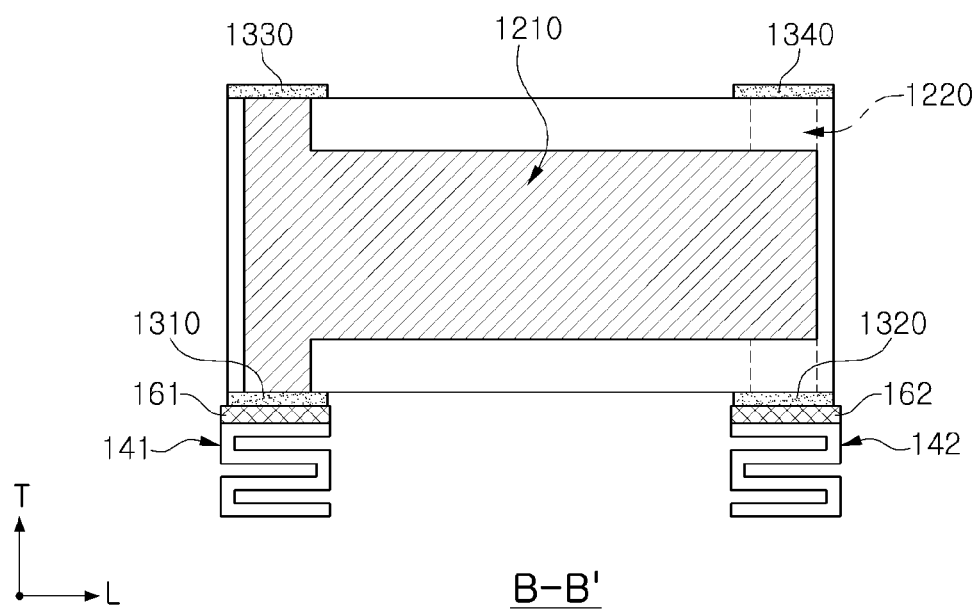
FIG. 8 is a cross-sectional view taken along line B-B' of FIG. 7.

FIG. 7 is a perspective view schematically illustrating a multilayer ceramic component according to another exemplary embodiment in the present disclosure; FIG. 8 is a cross-sectional view taken along line B-B' of FIG. 7; and FIG. 9 is an exploded perspective view illustrating an example of internal electrodes of the multilayer ceramic component of FIG. 7.

Here, since structures of first and second terminal electrodes 141 and 142 of a multilayer ceramic component 1000 are similar to those of the first and second terminal electrodes of the multilayer ceramic component according to the exemplary embodiment in the present disclosure described above, a detailed description therefore will be omitted in order to avoid overlapped descriptions, and a structure of a multilayer ceramic capacitor 1010 modified from the multilayer ceramic component according to the exemplary embodiment in the present disclosure described above will be described in detail.

Figure 9:
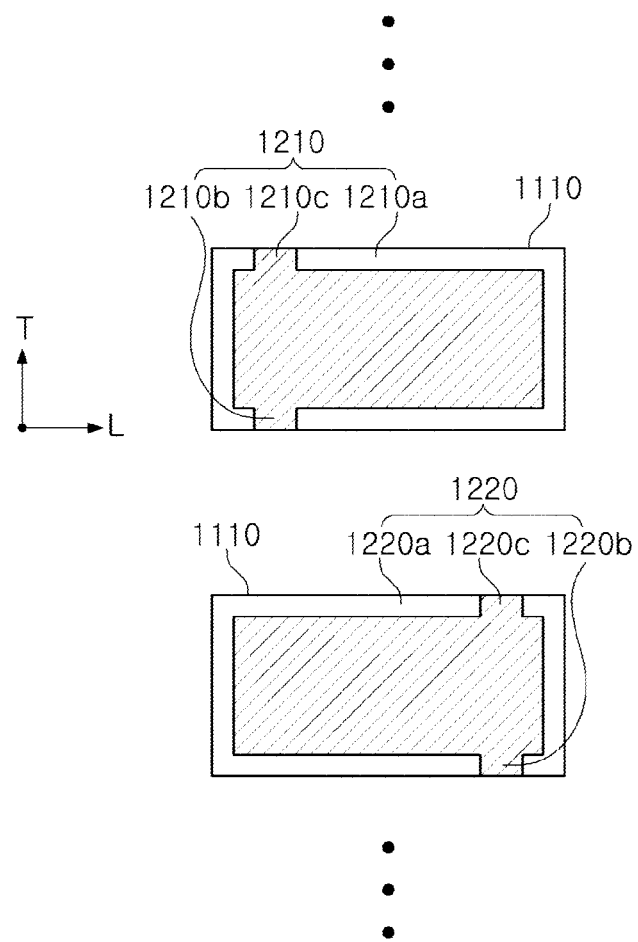
FIG. 9 is an exploded perspective view illustrating an example of internal electrodes of the multilayer ceramic component of FIG. 7.

Referring to FIGS. 7 through 9, a multilayer ceramic capacitor 1010 according to the present exemplary embodiment may include a ceramic body 1100, a plurality of first and second internal electrodes 1210 and 1220, first and second external electrodes 1310 and 1320 respectively connected to the first and second internal electrodes 1210 and 1220.

The ceramic body 1100 may include a plurality of dielectric layers 1110 stacked in the width direction.

The first and second internal electrodes 1210 and 1220 may be alternately disposed in the ceramic body 1100 with respective dielectric layers 1110 interposed therebetween.

The first internal electrode 1210 may include a first body part 1210a and a first lead part 1210b extended from the first body part 1210a to be exposed through a lower surface of the ceramic body 1100 in the thickness direction.

The second internal electrode 1220 may include a second body part 1220a overlapped with the first body part 1210a in the width direction and a second lead part 1220b extended from the second body part 1220a to be exposed through the lower surface of the ceramic body 1100 in the thickness direction. The second lead part 1220b may be disposed to be spaced apart from the first lead part 1210b in the length direction of the ceramic body 1100.

The first and second external electrodes 1310 and 1320 may be disposed on the lower surface of the ceramic body 1100 in the thickness direction to be spaced apart from each other.

In addition, the first and second external electrodes 1310 and 1320 may make contact and may be electrically connected to exposed end portions of the first and second lead parts 1210b and 1220b, respectively.

Here, the first and second external electrodes 1310 and 1320 may extend to portions of both side surfaces of the ceramic body 1100 in the width direction, respectively, if necessary, in order to improve adhesiveness, or the like.

In addition, the first external electrode 1310 may be disposed above the first upper horizontal part 141a of the first terminal electrode 141, and may be electrically connected to the first terminal electrode 141 by the first conductive adhesive layer 161.

The second external electrode 1320 may be disposed above the second upper horizontal part 142a of the second terminal electrode 142, and may be electrically connected to the second terminal electrode 142 by the second conductive adhesive layer 162.

The first internal electrode 1210 may further include a third lead part 1210c extended from the first body part 1210a to be exposed through an upper surface of the ceramic body 1100 in the thickness direction, if necessary.

The second internal electrode 1220 may further include a fourth lead part 1220c extended from the second body part 1220a to be exposed through the upper surface of the ceramic body 1100 in the thickness direction, if necessary.

Here, the fourth lead part 1220c may be disposed to be spaced apart from the third lead part 1210c in the length direction of the ceramic body 1100.

Here, third and fourth external electrodes 1330 and 1340 may be disposed on the upper surface of the ceramic body 1100 in the thickness direction to be spaced apart from each other. In addition, the third and fourth external electrodes 1330 and 1340 may contact and be electrically connected to exposed end portions of the third and fourth lead parts 1210c and 1220c, respectively.

Further, the third and fourth external electrodes 1330 and 1340 may be extended to portions of both side surfaces of the ceramic body 1100 in the width direction, respectively, if necessary, in order to improve adhesiveness, or the like.

Board Having Multilayer Ceramic Component

Figure 10:
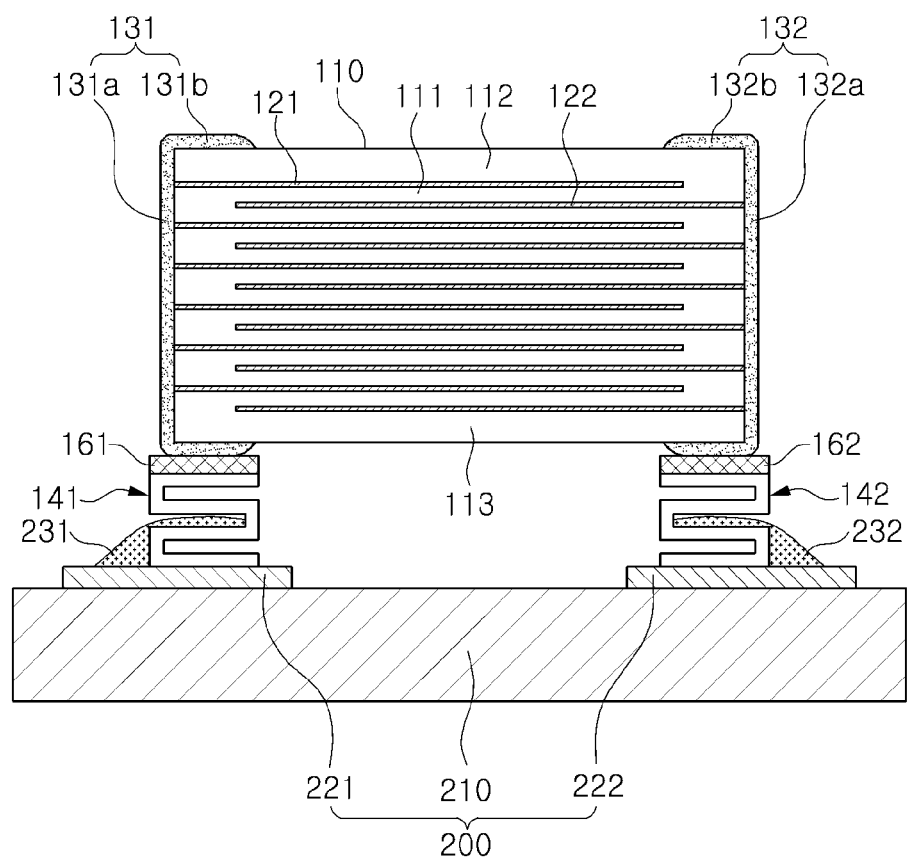
FIG. 10 is a cross-sectional view illustrating a form in which the multilayer ceramic component of FIG. 1 is mounted on a board.

Referring to FIG. 10, a board 200 having a multilayer ceramic component according to the exemplary embodiment in the present disclosure may include a circuit board 210 on which the multilayer ceramic component is horizontally mounted and first and second electrode pads 221 and 222 formed on an upper surface of the circuit board 210 to be spaced apart from each other.

Here, the multilayer ceramic component may be electrically connected to the circuit board 210 by solders 231 and 232 in a state in which the first and second lower horizontal parts 141d and 142d of the first and second terminal electrodes 141 and 142 are disposed on the first and second electrode pads 221 and 222, respectively, to contact the first and second electrode pads 221 and 221, respectively.

When a voltage applied to the multilayer ceramic component in a state in which the multilayer ceramic component is mounted on the circuit board 210, acoustic noise may be generated.

Here, sizes of the first and second electrode pads 221 and 222 may become indices in determining an amount of solders 231 and 232 connecting the first and second terminal electrodes 141 and 142 of the multilayer ceramic component and the first and second electrode pads 221 and 222 to each other, respectively, and a magnitude of the acoustic noise may be controlled depending on the amount of the solders 231 and 232.

At the time of mounting a horizontal type multilayer ceramic capacitor according to the related art not including terminal electrodes and having a size of 3216 on the board, acoustic noise of about 44 dB on average was generated. On the other hand, in a case of the multilayer ceramic component in which the terminal electrodes are attached to the mounting surface of the multilayer ceramic capacitor as in the present exemplary embodiment, the connecting part may include the plurality of horizontal parts and the vertical part, such that a length of the connecting part may be significantly increased, such that acoustic noise of about 25 dB, significantly lower than acoustic noise generated in a multilayer ceramic component according to the related art in which the connecting part includes only one vertical part, is generated on average.

That is, a length of the connecting part determining a distance at which vibrations are transferred in the terminal electrode may be significantly increased, and the connecting part may serve as a spring to provide a high degree of elastic force, whereby the acoustic noise may be significantly decreased.

In addition, the first and second terminal electrodes 141 and 142 of the multilayer ceramic component may absorb the mechanical stress generated due to the warpage of the circuit board 210, or the like, to allow the mechanical stress not to be transferred to the multilayer ceramic capacitor 101, thereby preventing damage to the multilayer ceramic capacitor such as cracking, or the like.

Figure 11:
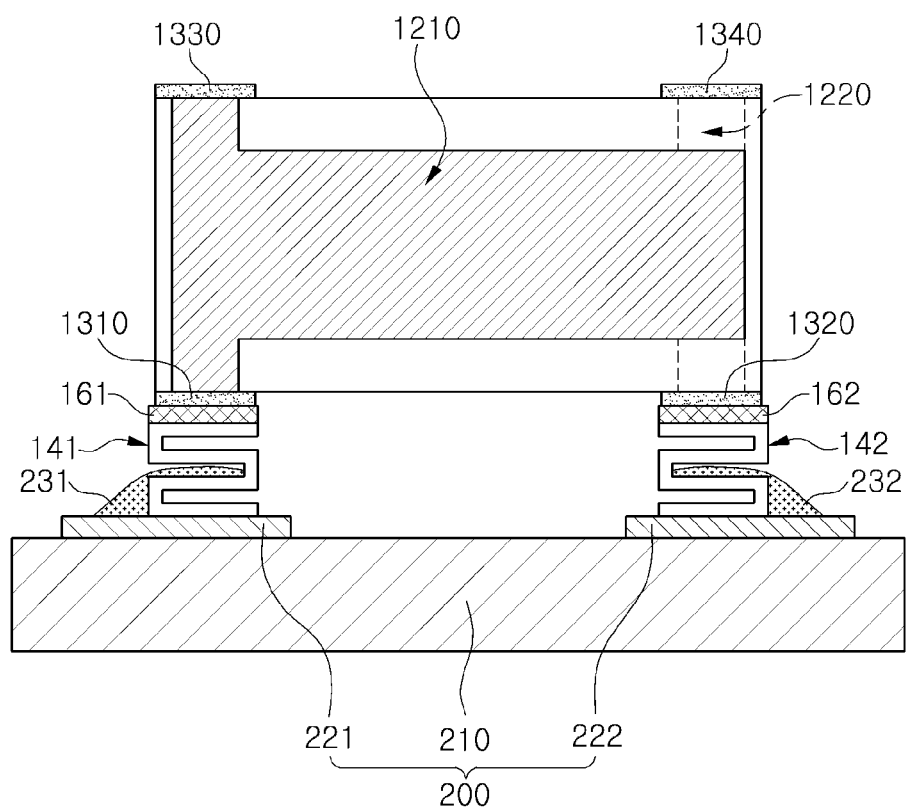
FIG. 11 is a side view illustrating a form in which the multilayer ceramic component of FIG. 7 is mounted on a board.

Meanwhile, FIG. 11 illustrates a board having a multilayer ceramic component according to another exemplary embodiment in the present disclosure. Here, since a structure other than a structure of the multilayer ceramic capacitor is similar to a structure according to the exemplary embodiment described above, a detailed description therefor will be omitted.

As set forth above, according to the exemplary embodiment in the present disclosure, the elastic force of the terminal electrodes may partially absorb the vibrations transferred through the external electrodes of the ceramic body, a predetermined interval may be secured between the multilayer ceramic capacitor and the board, and the solders may be accommodated in the space parts formed outwardly of the connecting parts connecting the upper horizontal parts and the lower horizontal parts to each other, such that heights of the solders may be lowered and the external electrodes and the solders may not directly contact each other, whereby the acoustic noise may be decreased.

While exemplary embodiments have been shown and described above, it will be apparent to those skilled in the art that modifications and variations could be made without departing from the scope of the present invention as defined by the appended claims.

What is claimed is:

1. A multilayer ceramic component comprising:
    a multilayer ceramic capacitor including first and second external electrodes disposed on a mounting surface of a ceramic body; and
    first and second terminal electrodes each including:
    an upper horizontal part disposed on a lower surface of the respective external electrode,
    a lower horizontal part disposed below the upper horizontal part and spaced apart from the upper horizontal part, and
    a connecting part connecting the upper horizontal part and the lower horizontal part,
    wherein each of the connecting parts of the first and second terminal electrodes includes:
    a plurality of horizontal parts disposed between the upper horizontal part and the lower horizontal part, first vertical parts connecting first ends of adjacent horizontal parts to each other, and
    at least one second vertical part connecting second ends of adjacent horizontal parts to each other,
    wherein the first and second vertical parts are alternately disposed in a vertical direction, and
    wherein the connecting part has a plurality of openings having an "]" or "[" shape alternately facing opposite end surfaces of the ceramic body.

2. The multilayer ceramic component of claim 1, wherein the vertical parts of the first and second terminal electrodes have curved surfaces.

3. The multilayer ceramic component of claim 1, further comprising first and second conductive adhesive layers disposed between the lower surfaces of the first and second external electrodes and the upper horizontal parts of the first and second terminal electrodes, respectively.

4. The multilayer ceramic component of claim 3, wherein the first and second conductive adhesive layers comprise a high melting-point solder or a conductive paste.

5. The multilayer ceramic component of claim 3, wherein widths of the upper horizontal parts of the first and second terminal electrodes are narrower than widths of the first and second conductive adhesive layers, respectively.

6. The multilayer ceramic component of claim 3, wherein widths of the upper horizontal parts of the first and second terminal electrodes are wider than widths of the first and second conductive adhesive layers, respectively.

7. The multilayer ceramic component of claim 1, wherein the ceramic body comprises a plurality of dielectric layers stacked in a thickness direction, a plurality of first and second internal electrodes disposed with at least one dielectric layer disposed between adjacent first and second internal electrodes, the first and second internal electrodes being alternately exposed through opposite end surfaces of the ceramic body in a length direction, and
the first and second external electrodes comprise first and second front surface parts respectively covering opposite end surfaces of the ceramic body in the length direction and respectively connected to the first and second internal electrodes, and first and second band parts respectively extended from the first and second front surface parts to cover portions of circumferential surfaces of the ceramic body, respectively.

8. The multilayer ceramic component of claim 7, wherein the ceramic body further comprises cover layers disposed on an uppermost internal electrode and beneath a lowermost internal electrode.

9. The multilayer ceramic component of claim 1, wherein the ceramic body includes a plurality of dielectric layers layered in a width direction, a plurality of first internal electrodes having first lead parts exposed through a lower surface of the ceramic body, and a plurality of second internal electrodes disposed to alternate with the first internal electrodes with at least one dielectric layer disposed between adjacent first and second internal electrodes and having second lead parts exposed through the lower surface of the ceramic body and disposed to be spaced apart from the first lead parts in a length direction, and
the first and second external electrodes are disposed on the lower surface of the ceramic body to be spaced apart from each other and connected to the first and second lead parts, respectively.

10. The multilayer ceramic component of claim 9, wherein the first and second external electrodes extend from the lower surface of the ceramic body to portions of side surfaces of the ceramic body.

11. The multilayer ceramic component of claim 9, further comprising third and fourth external electrodes disposed on an upper surface of the ceramic body to be spaced apart from each other,
wherein the first internal electrodes have third lead parts exposed through the upper surface of the ceramic body and connected to the third external electrode, and
the second internal electrodes have fourth lead parts exposed through the upper surface of the ceramic body and connected to the fourth external electrode.

12. The multilayer ceramic component of claim 11, wherein the third and fourth external electrodes extend from the upper surface of the ceramic body to portions of side surfaces of the ceramic body.

13. A board having a multilayer ceramic component, comprising:
a circuit board having a plurality of electrode pads; and
the multilayer ceramic component of claim 1 mounted on the circuit board such that lower horizontal parts of the terminal electrodes are bonded to the electrode pads.

* * * * *